Jan. 20, 1959 C. W. MUELLER ET AL 2,870,050

SEMICONDUCTOR DEVICES AND METHODS OF MAKING SAME

Filed June 25, 1957

INVENTORS
CHARLES W. MUELLER & JANE PRINTON
BY J. L. Whittaker
ATTORNEY 2,870,050

SEMICONDUCTOR DEVICES AND METHODS OF MAKING SAME

Charles W. Mueller, Princeton, and Jane M. Printon, Rutherford, N. J., assignors to Radio Corporation of America, a corporation of Delaware Application June 25, 1957, Serial No. 667,916

17 Claims. (Cl. 148—1.5)

This invention relates to improved semiconductor devices, and more particularly to improved methods of making rectifying barriers in semiconductor devices by the diffusion process.

Semiconductor devices include semiconductive bodies of such materials as germanium, silicon, silicon-germanium alloys, III–V compounds such as the phosphides, arsenides, and antimonides of aluminum, gallium, and indium, and II–VI compounds such as the sulfides, selenides, and tellurides of zinc, cadmium, and mercury. In semiconductor devices, for example diodes and transistors, the semiconductor body usually contains at least two regions of different conductivity type separated by a rectifying barrier.

Rectifying barriers, also known as PN junctions, may be fabricated in semiconductor bodies by means of the vapor diffusion technique. In this method a semiconductive body is placed in an atmosphere of a conductivity type-determining material. Type-determining materials are also known as active impurities, or doping agents. Molecules of the vaporized type-determining material impinge on the surface of the semiconductor body. The molecules diffuse into the bulk of the semiconductor for a short distance, rather than merely forming a coating or superficial layer upon the surface. The amount of diffusion depends on the temperature and duration period, the concentration of the impurity source and the diffusion constant of the particular impurity in the particular semiconductor used. The diffusion process results in the formation of a thin surface layer containing the diffused impurity material, so that the conductivity of the surface layer is different from that of the bulk. At the interface between the two regions of different conductivity, that is between the surface layer and the bulk of the semiconductive body, a rectifying barrier is formed.

The semiconductive wafer into which the active impurity is diffused may be of either conductivity type, or may also be intrinsic as desired. The impurity material may be selected to introduce conductivity of type opposite to that of the semiconductive wafer, or of the same type. If the latter, a layer of conductivity type the same as that of the bulk of the wafer, but different in magnitude of conductivity, is produced.

One previous method of accomplishing diffusion doping from the vapor state consists of placing the semiconductor wafer in a quartz tube, evacuating the tube, then introducing vapors of the desired conductivity type-determining material. Since this method requires the use of vacuum pumps and valves, it is slow as well as expensive, and is thus not suitable for mass production.

An object of the present invention is to provide improved methods of making semiconductor devices.

Another object of the invention is to provide improved methods of making semiconductor devices with one or more rectifying junctions.

Still another object of the invention is to provide improved methods of making semiconductor devices by the diffusion of conductivity type-determining material.

These and other objects of the invention are accomplished by heating the semiconductor wafers while they are exposed to the vapors emitted by a heated powder of semiconductive material which has been alloyed with the desired conductivity type-determining material. The amount of type-determining impurity material in the alloy is adjusted for the particular application, and may vary from about .0001 percent to 10 percent by weight. Advantageously, the semiconductor in the granulated source material may be the same one used to make the wafers. The powder acts as a source for vapors of the type-determining impurity, which diffuses into each surface of the semiconductor wafers.

The invention will be described in greater detail with reference to the accompanying drawing, in which.

Similar reference numerals are applied to similar elements throughout the drawing.

Figures 1, 2, 3A, 3B, 3C, 4, 5:
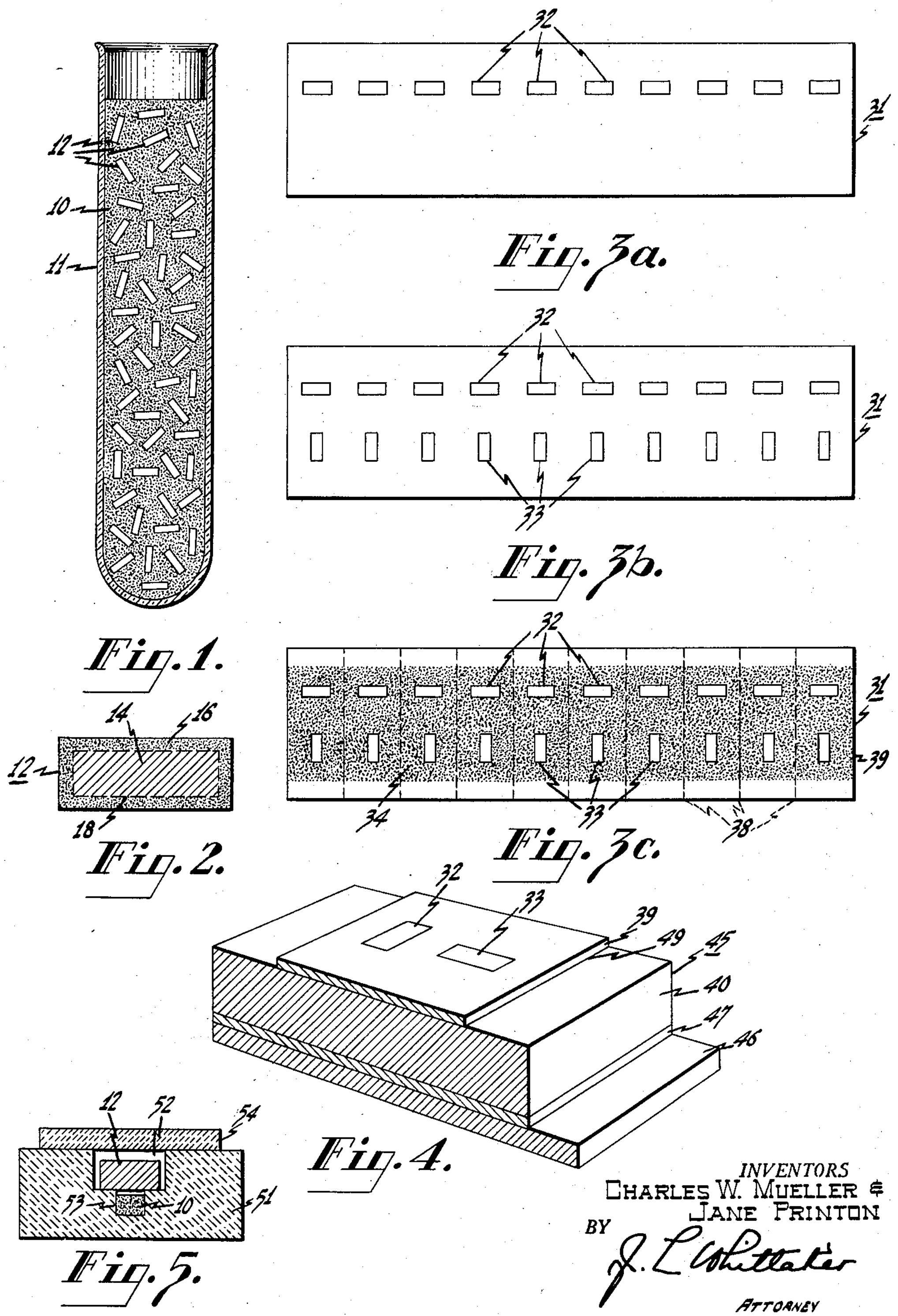
Figure 1 is a schematic cross-sectional view of semiconductor wafers being treated in accordance with the invention.
Figure 2 is a cross-sectional view of a semiconductor wafer which has been treated by the method of this invention.
Figures 3A–3C are schematic plan views of successive steps in the manufacture of a transistor according to the method of this invention.
Figure 4 is a perspective view of a transistor unit fabricated according to the method of this invention.
Figure 5 is a schematic cross-sectional view of semiconductor wafers being treated in accordance with another embodiment of the invention.

An example of the method of the invention as applied to forming a rectifying junction in a body of intrinsic germanium will now be described.

A solid alloy of the semiconductor and the type-determining impurity is prepared by melting the two materials together in the desired proportions. For some applications such as making power transistors, it is preferred to to use an alloy with the relatively high impurity concentration of about 10 percent, or about $10^{21}$ atoms of type-determining impurity per cubic centimeter of alloy. For other applications, such as making high frequency devices, it is preferred to use an alloy with the relatively low impurity concentration of about .0001 percent by weight, or about $10^{16}$ atoms of type-determining impurity per cubic centimeter of alloy. In this example, the semiconductor is intrinsic germanium, and the type-determining impurity material is arsenic. Pure germanium is melted in vacuo with sufficient arsenic to impart a resistivity of about .005 to .05 ohm centimeters to the resulting ingot. The alloys in this resistivity range usually contain about 2 to 20 milligrams of arsenic per 100 grams of germanium. The solid alloy of the semiconductor and the doping agent is then pulverized, so that all the particles of the resulting composition are less than 15 mils in diameter. It is preferred to remove the very fine particles by washing the powder in distilled water, so that substantially all of the remaining granules range from 1 to 15 mils in diameter.

Referring to Figure 1, the comminuted alloy composition 10 is placed in an inert heat-resistant container 11, which may for example be a quartz or a Vycor test tube. The semiconductor wafers 12 are dropped into the tube 11, and are covered with the doped powder 10 by shaking up the contents of the tube. The wafers 12 may be of any convenient size, such as 70 mils square and 7 mils thick. The wafers may be prepared from any of the semiconductive materials mentioned above. It has been found advantageous to use the same semiconductor for the powder 10 and the wafers 12, to avoid introducing extraneous impurities.

The wafer may be either P-type, N-type, or intrinsic, for producing PN, NN+, and IN junctions respectively. In this example, the wafers 12 consist of intrinsic germanium.

The tube 11 containing the wafers 12 immersed in the source powder 10 is placed in a furnace (not shown), and heated in an inert or non-oxidizing atmosphere, such as argon, nitrogen, or hydrogen. In this example, the ambient atmosphere is hydrogen. If desired, a cover may be placed over the tube to prevent the loss of some of the arsenic. The arsenic vapors given off by the source powder are uniformly distributed on each side of the germanium wafers because the wafers are separated by a porous medium.

The temperature and duration of heating depends on the volatility of the particular type-determining impurity used, the size of the particles in the granulated source material, the diffusion constant of the impurity in the particular semiconductor, and the desired depth of the junction. Increasing the temperature or duration of heating increases the distance into the wafer penetrated by the doping agent. Similarly, the use of a more volatile type-determining material, or a material having a higher diffusion constant, increases the depth of penetration by the impurity. However, increasing the size of the particles in the granulated source material decreases the amount of penetration by the type-determining material, while decreasing the particle size increases the distance penetrated by the impurity material, and hence increases the depth of the junction produced.

Figure 2 shows a semiconductor wafer 12 which has been treated by the method of this invention. The unchanged bulk of the semiconductor material 14 is surrounded by a thin surface layer 16 containing the diffused arsenic. A rectifying barrier 18 is formed at the interface of the diffused layer 16 and the bulk of the wafer 14. In this example, the arsenic-containing diffused layer 16 is of N-conductivity type, while the bulk of the wafer is intrinsic. The rectifying barrier 18 thus formed is an IN junction.

As explained above, the thickness of the diffused layer 16 can be controlled by varying the duration and temperature of the heating cycle. The thickness of the diffused layer 16, and hence the depth of the interface of barrier 18, can also be controlled by changing the particle size of the source powder 10. The smaller the particles, the greater the concentration of vaporized impurity and the more rapid the diffusion of the impurity into the wafer. For example, when the source powder is made of an alloy of about 100 grams germanium and 10 milligrams arsenic so as to have a resistivity of about .009 to .012 ohm centimeters, and all the particles in the powder are from 1 to 15 mils in diameter, then intrinsic germanium wafers packed in the source powder and heated 75 minutes at 825° C. in a hydrogen atmosphere will form an arsenic diffused surface layer 16 which is about 0.8 to 0.9 mil thick.

Semiconductor wafers can thus be prepared with a rectifying barrier at a predetermined depth. By controlling the process parameters of source resistivity, source particle size, and heating profile, the thickness of the diffused layer 16 can be kept uniform. An important advantage of this new method is that the particle size of the source material provides an additional parameter which can be readily controlled to give desired results in a reproducible manner. The method is also suitable for mass production, since pumps and complicated apparatus are not required, and a single Vycor tube 11 of source powder can contain a thousand wafers. A number of tubes may be placed in a rack, and all can be heated in the furnace at the same time.

It will be understood that the amount of impurity in the source powder can be varied within wide limits, depending on the particular materials or the type of device desired. For example, if a very high concentration of N-type impurity is desired, the source powder may be prepared by grinding an alloy composed of 90 percent germanium and 10 percent arsenic by weight.

Although this invention has been described in terms of diffusing arsenic into intrinsic germanium wafers, the method is equally adaptable to other N-type impurity materials, for example, antimony and phosphorus. The method may also be used for the introduction of P-type impurity material, for example gallium and indium. Some impurity materials, such as gallium, indium, and antimony, are considerably less volatile than arsenic and phosphorus. When such less volatile materials are employed as type-determining agents, the semiconductor wafers are heated in the source powder for relatively long periods, such as several hours. If a high melting semiconductor such as silicon is used, heating may be used to higher temperatures, such as 1000° C. The tube 11 is then preferably made of a refractory material such as aluminum oxide.

The semiconductor wafers need not be intrinsic. The method will work equally well on N-type or P-type wafers, so that NP, PN, PP+, and NN+ junctions may be made. The semiconductor wafers can also be made of silicon, or any of the compound semiconductors mentioned above, for example, indium phosphide and gallium arsenide, using appropriate doping agents in each case. Other modifications are possible without departing from the spirit and scope of the invention.

The fabrication of a transistor will now be described as an illustration of another embodiment of the use of this invention in making semiconductor devices.

Monocrystalline germanium is prepared by any convenient known method, and is doped with a P-type impurity such as indium to a resistivity of 1 ohm centimeter. Wafers of the material are prepared about .5" x .05" x 7 mils thick. A source powder is made by pulverizing germanium which has been doped with sufficient arsenic to have a resistivity of about .001 ohm centimeter. Such an alloy may be prepared from 100 milligrams of pure arsenic and 100 grams of pure germanium. The powder is washed with distilled water to remove the very small particles, so that substantially all of the remaining particles are from 1 to 15 mils in diameter. The wafers are immersed in the source powder and heated in a hydrogen furnace for 30 minutes at 800° C. Arsenic diffuses from the source powder into each surface of the P-type germanium wafers, and thus forms a layer of N-type germanium over the entire surface area of each wafer. This N-type layer is about 0.2 mil thick, extending into the depth of the wafer. Since the bulk of the material is P-type, a PN junction is thus produced, which is close to the surface of the wafer.

The semiconductor wafers having rectifying junctions made as above described may then be fabricated into transistor devices as follows.

Referring to Figure 3A, one broad surface of a P-conductivity type germanium wafer 31 diffused with arsenic as above described is treated by depositing a film of aluminum on a number of small areas 32. The aluminum may for example be deposited by evaporation. The aluminum makes a rectfiying junction with the arsenic doped germanium, and serves as an emitter electrode dot. In this example ten such emitter areas are spaced along the face of the wafer.

Referring to Figure 3B, a short distance from each emitter dot 32 a small area of the wafer surface is coated with a film of gold 33 containing about 0.5 percent antimony. Each gold dot 33 serves as an ohmic base connection.

Referring to Figure 3C, a portion 39 of the wafer surface including and immediately surrounding the emitter dots 32 and the base dots 33 is covered with material 34 that resists acid etching, such as lacquer or polystyrene. The wafer is then immersed in a suitable acid etch to remove the entire diffused arsenic layer except for the area 39 covered by the resist. One etchant that may be used consists of 1 part by volume of concentrated nitric acid, 1 part by volume hydrochloric acid, and 1 part by volume water. The wafer is next washed in distilled water and then cut along the lines 38 so as to form ten units 45. Each unit contains an aluminum emitter dot, and a gold-antimony base dot.

Referring to Figure 4, each unit 45 is attached to a metal tab 46 by a layer of solder 47 on the surface of the collector region 40 opposite to the dot pair 32 and 33. The metal tab 46 serves as the collector electrode connection. Suitable metals for the tab 46 are nickel, copper, and Kovar. The solder 47 may, for example, be indium. The P–N junction 49 is formed between the P-conductivity type collector region 40 and the N-conductivity type base region 39 which was diffused with arsenic. The unit is completed by attaching leads (not shown) to the aluminum dot 32 as the emitter, to the gold-antimony dot 33 as base, and to the metal tab 46 as collector electrode connection.

Satisfactory transistors have been made by this method, having an $\alpha_{cb}$ ranging between 20 and 100. The units have a low frequency gain of 35–40 db, and an alpha cut-off which ranges from 50–120 megacycles.

It has been found that the same powder may be used over again for about ten times without losing its effectiveness. The etching compositions described above are not critical in the practice of the invention. Other known etching compositions may be substituted. For example, the etching of germanium devices may be alternatively accomplished by electrolytic treatment in alkaline solutions. If different semiconducting materials are used, other etchants will be preferred.

Another embodiment of the invention is particularly useful when it is desired to use a source powder having a relatively high concentration of active impurity material. For applications where heavy doping is required, such as the fabrication of power transistors, the source powder may for example consist of germanium and about 0.5 to 10 percent arsenic by weight. When treating semiconductor wafers with such concentrated materials, the source powder may stick to the wafer surface if they are in contact. In such cases the alternative method shown in Figure 5 may be used. A container 51, which may be of quartz or Vycor, is prepared with a well 52 that is a little larger than the semiconductor wafers to be treated. The bottom of the well 52 communicates with a recess 53 which is smaller than the wafers being processed. The source powder 10 is placed in the recess 53. The semiconductor wafer 12, or a plurality of such wafers, is placed in the well 52. The container 51 is then heated in an inert or non-oxidizing atmosphere. During this step, vapors of the type-determining material diffuse into all the surfaces of the wafers. If desired, a cover 54, of the same material as the container 51, may be placed over the well 52 during the heating step in order to confine the vapors to the well 52. In this embodiment there is no direct contact between the wafers 12 and the source powder 10, hence sticking of the powder to the wafer is prevented.

A feature of this invention is that the concentration of the impurity vapor is kept low enough to prevent the formation of droplets of impurity material on the surface of the wafers. Such droplets sometimes form when the older methods are used. They are undesirable because they result in non-uniform junctions.

While the foregoing example has been directed to the fabrication of a transistor, the method outlined above is suitable for the manufacture of rectifiers and other types of semiconductive devices which contain at least one rectifying junction.

What is claimed is:

1. In the fabrication of rectifying junctions by the introduction of a vaporized conductivity type-determining substance into semiconductor wafers, the improvement comprising exposing said wafers to the vapors emitted by powdered semiconductive material which has been alloyed with up to 10 percent by weight of said type-determining substance, and heating said wafers and said powdered alloy material so that said vaporized type-determining substance diffuses into said wafers and forms a rectifying junction at a predetermined depth.

2. In a process for the production of rectifying junctions by the diffusion of a conductivity type-determining substance into semiconductor wafers, the steps comprising immersing said wafers in pulverized semiconductive material which has been alloyed with the desired type-determining substance so as to contain $10^{16}$ to $10^{21}$ atoms of said type-determining substance per cubic centimeter, and heating said wafers in said pulverized alloyed material so that said vaporized type-determining substance diffuses into said wafers and forms a rectifying junction at a predetermined depth.

3. In a process for the production of rectifying junctions by the diffusion of a conductivity type-determining substance into semiconductor wafers, the steps comprising exposing said wafers to the vapors emitted by pulverized semiconductive material which has been alloyed with the desired type-determining substance so as to contain $10^{16}$ to $10^{21}$ atoms of said type-determining substance per cubic centimeter, and heating said wafers and said pulverized alloyed material so that said vaporized type-determining substance diffuses into said wafers and forms a rectifying junction at a predetermined depth.

4. In a process for the production of rectifying barriers by the introduction of vaporized arsenic into semiconductor wafers, the steps comprising immersing said wafers in a comminuted composition consisting of an alloy of up to 10 percent by weight arsenic and semiconductive material, and heating said wafers in said comminuted composition so that said arsenic vaporizes without forming a liquid and diffuses into the surface of said wafers to form a rectifying junction at a predetermined depth.

5. In a process for the production of rectifying barriers by the introduction of vaporized arsenic into semiconductor wafers, the steps comprising exposing said wafers to the vapors emitted by a heated comminuted composition consisting of an alloy of up to 10 percent by weight arsenic and semiconductive material, and heating said wafers and said comminuted composition so that said arsenic vaporizes without forming a liquid and diffuses into the surface of said wafers to form a rectifying junction at a predetermined depth.

6. In a process for the production of rectifying barriers by the introduction of vaporized arsenic into semiconductor wafers, the steps comprising immersing said wafers in a comminuted alloy of arsenic and semiconductive material, said alloy containing sufficient arsenic to have a resistivity of .005 to .05 ohm centimeter, and heating said wafers in said comminuted alloy so that said arsenic vaporizes without forming a liquid and diffuses into the surface of said wafers to form a rectifying barrier at a predetermined depth.

7. In a process for the production of rectifying barriers by the introduction of vaporized arsenic into semiconductor wafers, the steps comprising exposing said wafers to the vapors emitted by a heated comminuted alloy of arsenic and semiconductive material, said alloy containing sufficient arsenic to have a resistivity of .005 to .05 ohm centimeter, and heating said wafers and said comminuted alloy so that said arsenic vaporizes without forming a liquid and diffuses into the surface of said wafers to form a rectifying barrier at a predetermined depth.

8. In a process for the production of rectifying junctions by the introduction of antimony into semiconductor wafers, the steps comprising immersing said wafers in a comminuted composition consisting of an alloy of semiconductive material and up to 0.5 percent antimony by weight, and heating said wafers in said comminuted composition so that said antimony vaporizes without forming a liquid and diffuses into the surface of said wafers to form a rectifying junction at a predetermined depth.

9. In a process for the production of rectifying barriers by the introduction of indium into semiconductive wafers, the steps comprising immersing said wafers in a comminuted composition consisting of an alloy of semiconductive material and up to 0.5 percent by weight indium, and heating said wafers in said comminuted composition so that said indium vaporizes without forming a liquid and diffuses into the surface of said wafers to form a rectifying junction at a predetermined depth.

10. In a process for the production of rectifying barriers by the introduction of a vaporized conductivity type-determining substance into semiconductor wafers, said semiconductor being selected from the group consisting of germanium, silicon, germanium-silicon alloys, the semiconductive III–V compounds, and the semiconductive II–VI compounds, the steps comprising immersing said wafers in a powder composed of semiconductive material containing $10^{16}$ to $10^{21}$ atoms per cubic centimeter of the desired type-determining substance, and heating said powder and said wafers so that said type-determining substance vaporizes without forming a liquid and diffuses into the entire surface of said wafers to form a rectifying junction at a predetermined depth.

11. In the fabrication of rectifying junctions by the introduction of vaporized N-conductivity type-determining material into semiconductive germanium wafers, the improvement comprising immersing said wafers in a triturated composition consisting of an alloy of germanium and up to 10 percent arsenic, and heating said wafers in said triturated composition in a hydrogen atmosphere so that said arsenic vaporizes without forming a liquid and diffuses into all the surfaces of said germanium wafers to form a rectifying junction at a predetermined depth.

12. In the fabrication of rectifying junctions by the introduction of vaporized N-conductivity type-determining material into semiconductive germanium wafers, the improvement comprising exposing said wafers to the vapors emitted by a heated triturated composition consisting of an alloy of germanium and up to 10 percent arsenic, and heating said wafers and said triturated composition in a hydrogen atmosphere so that said arsenic vaporizes without forming a liquid and diffuses into all the surfaces of said germanium wafers to form a rectifying junction at a predetermined depth.

13. In the fabrication of rectifying barriers by the introduction of volatilized N-conductivity type-determining material into semiconductive germanium wafers, the improvement comprising immersing said wafers in a comminuted alloy of germanium and up to 10 percent by weight arsenic, and heating said wafers in said comminuted alloy in a hydrogen atmosphere for about 75 minutes at about 825° C., so that said arsenic vaporizes without forming a liquid and diffuses into all the surfaces of said germanium wafers to form a rectifying junction at a predetermined depth.

14. In the fabrication of rectifying barriers by the introduction of volatilized N-conductivity type-determining material into semiconductive germanium wafers, the improvement comprising immersing said wafers in a pulverized alloy of germanium and arsenic, said alloy containing sufficient arsenic to have a resistivity of about .005 to .05 ohm centimeter, and heating said wafers in said pulverized alloy in a hydrogen atmosphere so that said arsenic vaporizes without forming a liquid and diffuses into all the surfaces of said wafers to form a rectifying junction at a predetermined depth.

15. In the fabrication of rectifying junctions by the introduction of volatilized N-conductivity type-determining material into semiconductive germanium wafers, the improvement comprising immersing said wafers in a granulated alloy of germanium and up to 10 percent by weight arsenic, said granulated alloy having substantially all particles ranging from 1–15 mils in diameter, and heating said wafers in said granulated alloy in a hydrogen atmosphere so that said arsenic vaporizes without forming a liquid and diffuses into all the surfaces of said wafers to form a rectifying junction at a predetermined depth.

16. In the fabrication of rectifying junctions by the introduction of volatilized N-conductivity type-determining material into semiconductive germanium wafers, the improvement comprising exposing said wafers to the vapors emitted by a heated granulated alloy of germanium and up to 10 percent by weight arsenic, said granulated alloy having substantially all particles ranging from 1–15 mils in diameter, and heating said wafers and said granulated alloy in a hydrogen atmosphere so that said arsenic vaporizes without forming a liquid and diffuses into all the surfaces of said wafers to form a rectifying junction at a predetermined depth.

17. In the fabrication of rectifying junctions by the introduction of vaporized N-conductivity type impurity material into semiconductive germanium wafers, the improvement comprising immersing said wafers in a crushed alloy of germanium and arsenic, said crushed alloy having substantially all granules between 1 and 15 mils in diameter, said alloy containing sufficient arsenic to have a resistivity of about .005 to .05 ohm centimeter, and heating said wafers in said crushed composition in a hydrogen atmosphere for about 75 minutes at about 825° C. so that said arsenic vaporizes without forming a liquid and diffuses into all the surfaces of said wafers to form a rectifying junction at a predetermined depth.

References Cited in the file of this patent

UNITED STATES PATENTS

| | | |
|---|---|---|
| 2,071,533 | Ihrig | Feb. 23, 1937 |
| 2,536,774 | Samuel | Jan. 2, 1951 |
| 2,622,043 | Roush | Dec. 16, 1952 |
| 2,629,672 | Sparks | Feb. 24, 1953 |
| 2,695,852 | Sparks | Nov. 30, 1954 |
| 2,727,839 | Sparks | Dec. 20, 1955 |
| 2,742,383 | Barnes et al. | Apr. 17, 1956 |
| 2,759,861 | Collins et al. | Aug. 21, 1956 |
| 2,762,705 | Spear et al. | Sept. 11, 1956 |
| 2,765,245 | English et al. | Oct. 2, 1956 |
| 2,802,760 | Derick et al. | Aug. 13, 1957 |

FOREIGN PATENTS

| | | |
|---|---|---|
| 1,132,101 | France | Oct. 29, 1956 |
| 760,649 | Great Britain | Nov. 7, 1956 |
| 1,133,343 | France | Nov. 19, 1956 |